United States Patent [19]
Lowrey et al.

[11] Patent Number: 5,110,754
[45] Date of Patent: May 5, 1992

[54] METHOD OF MAKING A DRAM CAPACITOR FOR USE AS AN PROGRAMMABLE ANTIFUSE FOR REDUNDANCY REPAIR/OPTIONS ON A DRAM

[75] Inventors: Tyler A. Lowrey; Kevin G. Duesman; Eugene H. Cloud, all of Boise, Id.

[73] Assignee: Micron Technology, Inc., Boise, Id.

[21] Appl. No.: 771,688

[22] Filed: Oct. 4, 1991

[51] Int. Cl.$^5$ .............................. H01L 21/70
[52] U.S. Cl. ..................... 437/52; 437/47; 437/48; 437/60; 437/919; 437/922
[58] Field of Search ............ 437/47, 48, 52, 60, 437/170, 922, 919; 357/45, 51; 365/200; 307/219

[56] References Cited

U.S. PATENT DOCUMENTS

| | | |
|---|---|---|
| 4,543,594 | 9/1985 | Mohsen et al. .................. 357/51 |
| 4,635,345 | 1/1987 | Hankins et al. .................. 437/922 |
| 4,881,114 | 12/1989 | Mohsen et al. .................. 357/51 |
| 4,899,205 | 2/1990 | Hamdy et al. .................. 357/51 |
| 4,943,538 | 7/1990 | Mohsen et al. .................. 437/922 |
| 5,017,510 | 5/1991 | Welch et al. .................. 437/922 |
| 5,070,384 | 12/1991 | McCollum et al. .................. 437/193 |

*Primary Examiner*—Tom Thomas
*Attorney, Agent, or Firm*—David J. Paul

[57] ABSTRACT

The invention is directed to a concept to use a 3-dimensional DRAM capacitor as a one-time non-volatile programming element (programmable antifuse) to make redundancy repair and/or to select other options on a DRAM. The programmable element of the present invention provides some significant advantages, such as a lower programming voltage, which allows use of the DRAM's existing operating supply, and requiring only half of the operating voltage to test the element once programming is accomplished. The lower programming voltage allows for redundancy repair of defective DRAM cells (or selecting other options) to be made after the DRAM die is packaged including after it is installed at a customer's site.

12 Claims, 7 Drawing Sheets

METHOD OF MAKING A DRAM CAPACITOR FOR USE AS AN PROGRAMMABLE ANTIFUSE FOR REDUNDANCY REPAIR/OPTIONS ON A DRAM

FIELD OF THE INVENTION

This invention relates to semiconductor devices and more particularly to an antifuse element fabricated in a Dynamic Random Access Memories (DRAM). A 3-dimensional, stacked or trench DRAM capacitor, built with a thin dielectric, is used as a one-time programmable non-volatile programming element (antifuse) to make redundancy repair and/or to select other options on a DRAM.

BACKGROUND OF THE INVENTION

One time programming by means of electrical fuses are used on Integrated Circuits (ICs) for a variety of application including, implementation of redundant rows and columns for memory products, programming of various options or operating modes of an IC, and component value fine tuning, such as for resistors or capacitors. Other typical uses of one time programming of data are found in numerous memory storage applications including, programmable array logic (PALs), programmable logic devices, and Programmable Read Only Memories (PROMs).

Fabrication and programming of fuses on ICs has conventionally been done by constructing metal fuses that are then blown open by applying high current through the fuse. Another method is by constructing either metal or polysilicon (or poly) fuses which are blown open with a laser. Other techniques make use of floating gate technology where charge is stored on a floating gate by tunnelling electrons through an insulator.

Some big drawbacks to these conventional approaches include the following. When programming with metal fuses high current drivers or fuse blowing pads must be fabricated into the IC in order to provide or handle the high current required to blow the desired fuse. These added drivers and pads, unfortunately, take up considerable real estate on the IC die, which on memory intensive devices is very undesirable. Some disadvantages of blowing a metal or poly fuse by a laser include, very tight alignment tolerances between the laser beam and fuse, not to mention the expense of the laser itself. Both methods can leave residual splatter that may later allow the fuse to heal itself and become a resistive short thereby destroying previous programming and lowering the ICs reliability. If floating gate technology is used, a high supply voltage (typically between 10–30 V) is required to program the storage element. This means an external supply will be required for programming.

Figure 1:
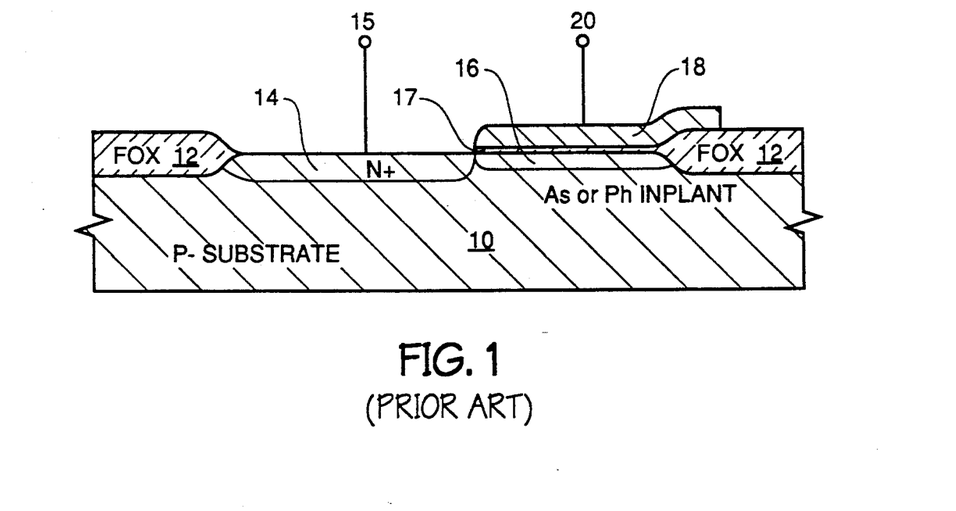
FIG. 1 shows a cross-sectional view of a prior art planar capacitor constructed for use as a programmable fusible link.
Figure 2:
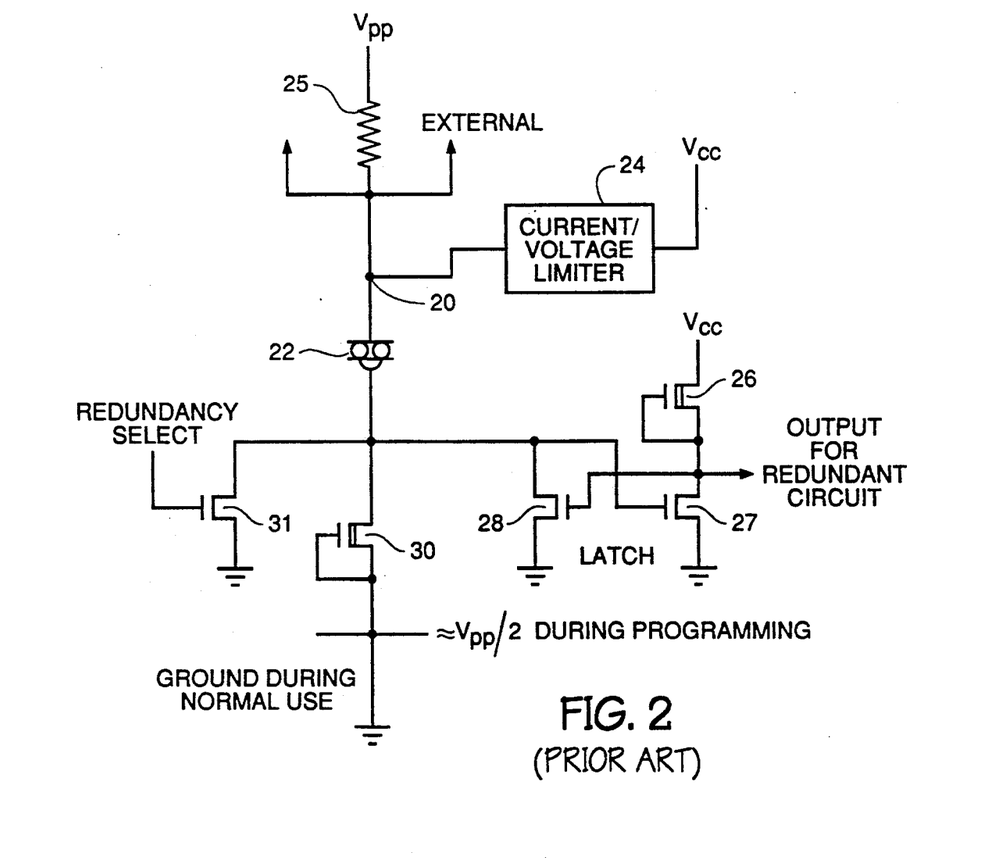
FIG. 2 shows a schematical representation of the circuitry required to program the fusible link of FIG. 1.

U.S. Pat. No. 5,453,594 suggests using a planar capacitor, reproduced in FIG. 1, as a fusible link. As FIG. 1 shows the planar capacitor is built over diffusion region 16 (used as a bottom plate) with a single thick oxide 17, used as the capacitor cell dielectric, followed by a doped poly layer 18 serving as a top plate. Diffusion region 16 is in turn connected to diffusion region 14. In order to program this capacitor as a fusible link a large external supply between 10-20 V must be applied between capacitor plates 16 and 18 via connecting nodes 20 and 15. As shown in FIG. 2, the external supply $V_{PP}$ is applied via resistor 25 and, with the appropriate logic, fusible link 22 establishes a conductive path from plate 16 to plate 18 by break down of dielectric 17 (of FIG. 1). Of course, both programming tools, supply $V_{PP}$ and resistor 25, are removed from the circuitry once programming is accomplished. In addition current/voltage limiter circuit 24 must be fabricated into the integrated circuit containing the device in order to protect the programmed fusible link from any high surge of current that could open the conductive path established between plates 16 and 18 and thus render the device useless. This programming method is not only costly and inefficient but is impractical for use in DRAMs of high density such as the 1 Meg and beyond, due to the excessive real estate required and the lack of readily available planar capacitors.

Figure 3:
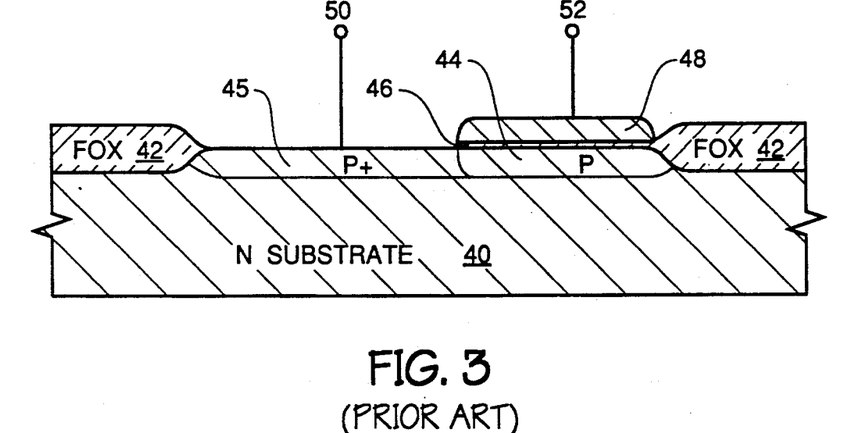
FIG. 3 shows a cross-sectional view of a prior art planar capacitor constructed for use as a programmable antifuse link for PROMs.

U.S. Pat. No. 4,881,114 develops a programmable antifuse element out of two conductive layers separated by a multiple dielectric layer for use in PROMs. The concepts and disadvantages are much the same as those in U.S. Pat. No. 4,543,594 except, as shown in FIG. 3, cell dielectric 46 is made of oxide/nitride/oxide (ONO) layers. The programmable element of U.S. Pat. No. 4,881,114 is a planar structure which requires a programming voltage in the neighborhood of 30 V, which means an external supply is required.

SUMMARY OF THE INVENTION

The present invention introduces a concept to use a 3-dimensional DRAM capacitor, made with a thin cell dielectric, as a one-time programmable non-volatile programming element (antifuse) requiring no external programming voltage, to be employed for redundancy repair and/or to select other options on a DRAM.

The programmable element of the present invention provides some significant advantages including a lower programming voltage which allows use of the DRAM's normal operating supply, and requiring only half of the operating voltage to test the element once programming is accomplished. The lower programming voltage allows for redundancy repair of defective DRAM cells (or selecting other options) to be made at various stages during the DRAM's fabrication and packaging. These various stages include, after fabricated die are electrically functional, after DRAM die are mounted onto a mounting substrate (such as a lead frame or other connecting forms), after the mounted DRAM die are housed into packages comprised of ceramic or plastic or other housing materials, and after the packaged die are mounted onto other assemblies (such as multichip modules or printed circuit boards) and installed into an electrical system at a customer's site. The programmed element can be tested after the manufacturing stages listed above as well, due to a low testing voltage of no greater than one half the DRAM's operating supply being all that is required.

DETAILED DESCRIPTION OF THE PREFERRED EMBODIMENT

The invention is directed to making use of a 3-dimensional storage cell as a programmable antifuse element in a DRAM. First, attention is called to the circuit of FIG. 4 for the purpose of showing how the present invention may be programmed. Various redundancy repair schemes in DRAMs are well know in the art and therefore is not covered in this text.

Figure 4:
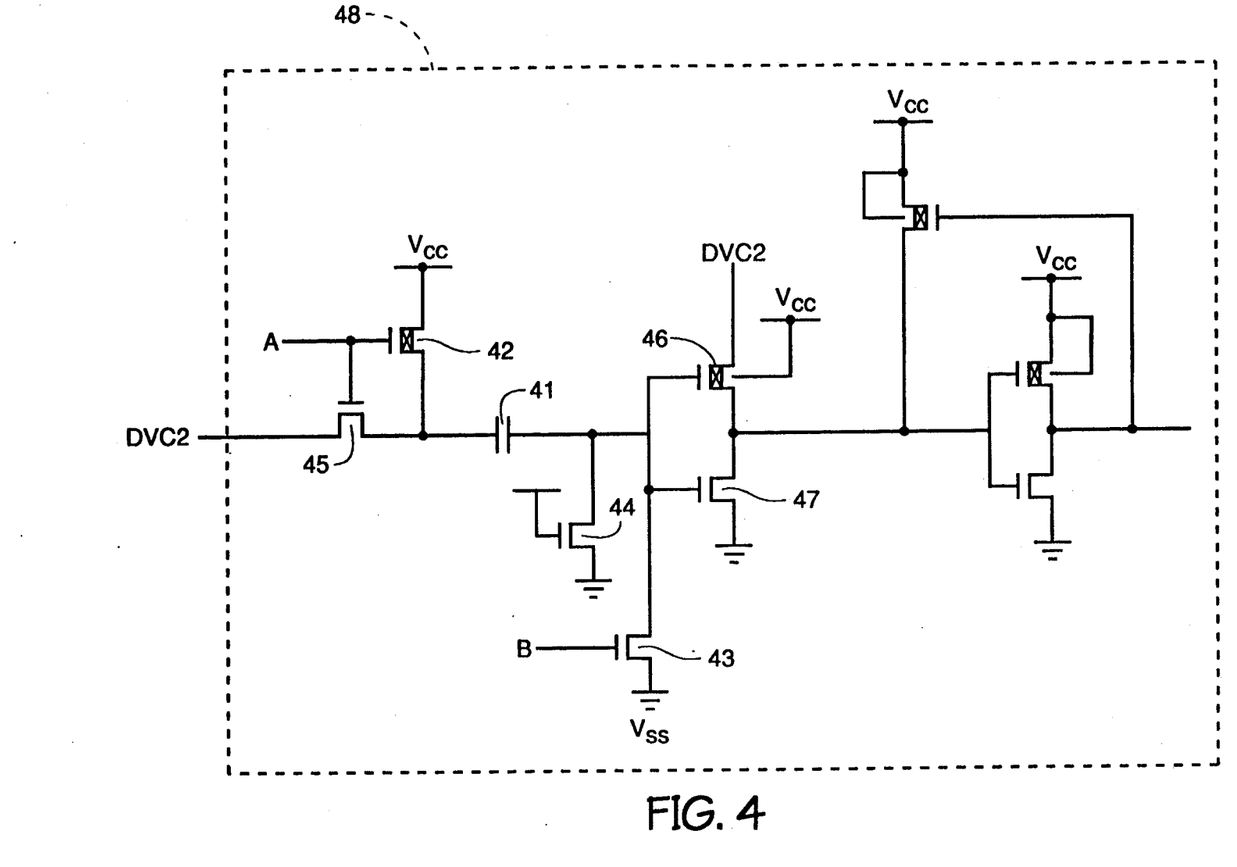
FIG. 4 is a schematical representation showing the antifuse structure and its associated programming logic.

As depicted in FIG. 4, 3-dimensional programmable antifuse structure 41 is coupled into a programming logic scheme used to replace a defective storage cell at a given address with an unused redundant cell in the memory array. In an unprogrammed state NMOS 44 (long L channel) serves as an active pulldown to provide a predetermined low state to the gates of CMOS inverter comprising PMOS transistor 46 and NMOS transistor 47. However, the output of NMOS 44 is overridden when antifuse 41 becomes programmed.

To program antifuse 41, a low signal is placed on node A thereby turning off transmission gate 45 and turning on PMOS transistor 42. This action places the circuit's operating supply voltage ($V_{CC}$ in this case) on one plate of antifuse 41. Next, a signal at node B is pulsed low thereby turning on the NMOS transistor 43 which in turn places a low potential ($V_{SS}$ in this case) on the opposite plate of antifuse 41. The large voltage potential developed across antifuse 41 causes the dielectric between its two plates to rupture and thereby force the conductive material making up the two plates (polysilicon is preferred) to migrate together, thus resulting in a resistive short of much less than 1 Meg ohm. Now normal circuit operation of repair circuit 48 uses the appropriate logic, via signal $DVC_2$, to steer the corrected address to a good storage cell located in a redundant bank of cells. A logic scheme similar to that of FIG. 4 could also be used to select various options available on a DRAM such as fast page mode, static column mode or nibble mode.

Process steps to construct antifuse element 41 of FIG. 4 begins with a silicon wafer being prepared using conventional process steps up to the point of defining a memory cell array in a DRAM. During the process steps to construct the capacitors for each memory cell in the array, fabrication to construct the programmable antifuse follow in step. Although the following process described uses stacked capacitor technology, it will become readily apparent for one skilled in the art to adopt the described process into other processes used to develop 3-dimensional capacitors, such as trench capacitor technology, in order to develop and utilize the antifuse structure of the present invention.

The process steps to realize the programmable antifuse element in high density/high volume DRAM fabrication process, presented in FIGS. 5-12, will now follow.

Figure 5:
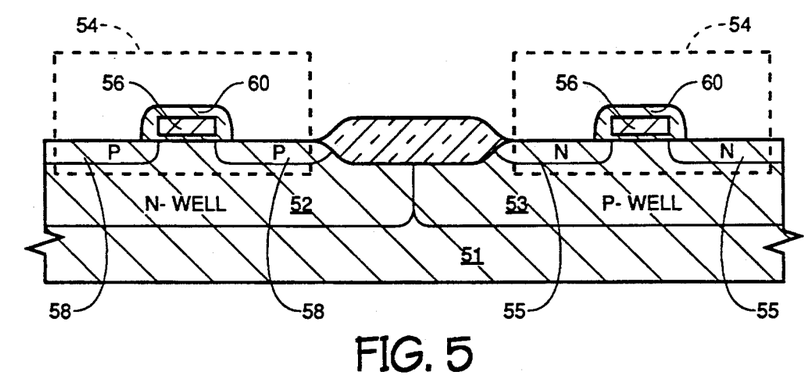
FIGS. 5-12 are cross-sectional views showing the processing steps to fabricate a 3-dimensional programmable antifuse structure of the present invention into a DRAM.

As shown in FIG. 5, n-well 52 and p-well 53 have been defined in wafer substrate 51. An NMOS transistor 54 has been formed from n-type diffusion 55 and NMOS gate 56. Also, a PMOS transistor 57 has been formed out of p-type diffusion areas 58 and PMOS gate 59. Both transistor gates 56 and 59 are isolated with dielectric 60.

Figure 6:
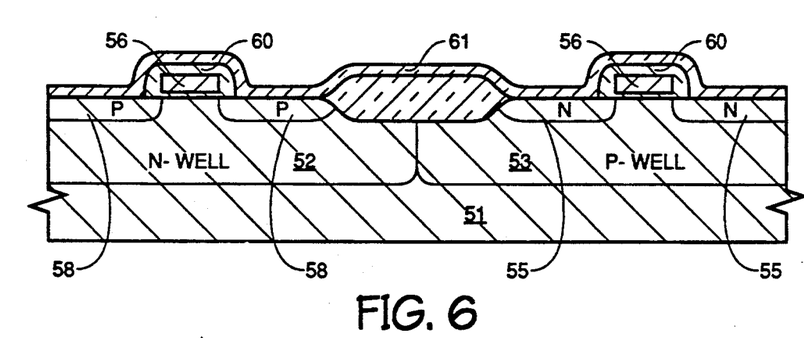

Referring now to FIG. 6, a blanket layer of dielectric 61 is deposited over the existing wafer surface of FIG. 5.

Figure 7:
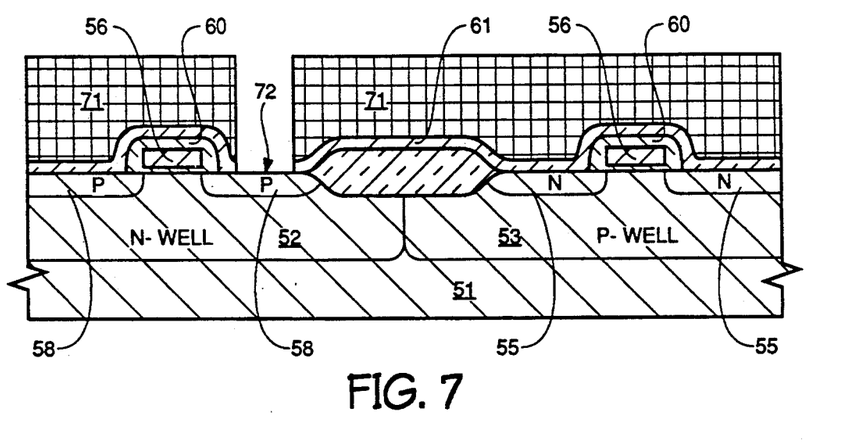
Figure 8:
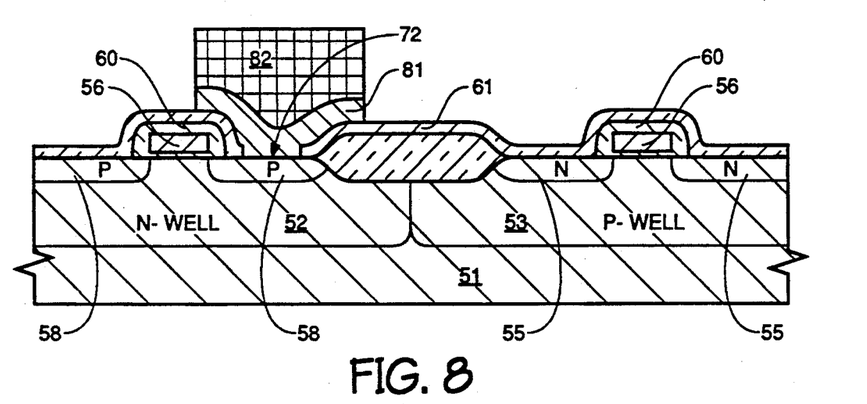

Referring now to FIG. 7, photoresist 71 is placed and patterned using an appropriate mask to open buried contact location 72 followed by a photoresist 71 strip (not shown but apparent in FIG. 8).

Referring now to FIG. 8, polysilicon 81 is deposited and then patterned by photoresist 82 to overlie a diffusion region 58 of PMOS transistor 57. Polysilicon 81 is then doped to an n-type conductivity thereby forming a buried contact at location 72. Photoresist 82 is then stripped (not shown but apparent in FIG. 9).

Figure 9:
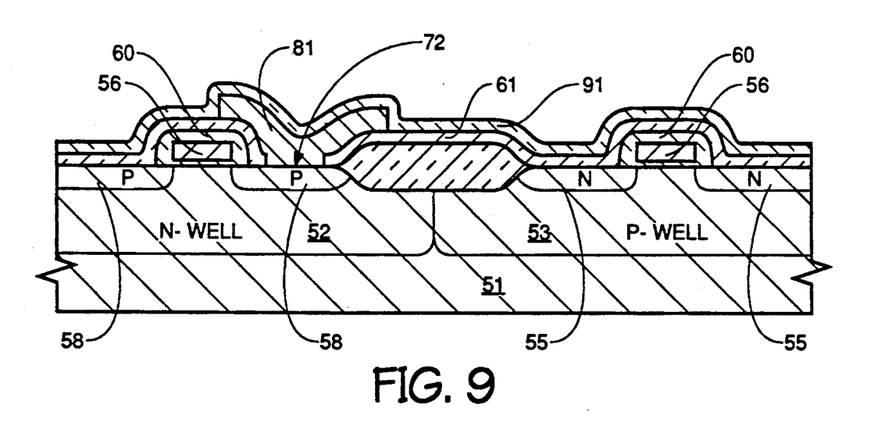

Referring now to FIG. 9, a blanket layer of thin dielectric 91 is deposited over the existing wafer surface of FIG. 8. It is preferred to used a dielectric made up of oxide/nitride/oxide due to its ability to retain good dielectric integrity while having a thickness of only 25 to 100 Å.

Figure 10:
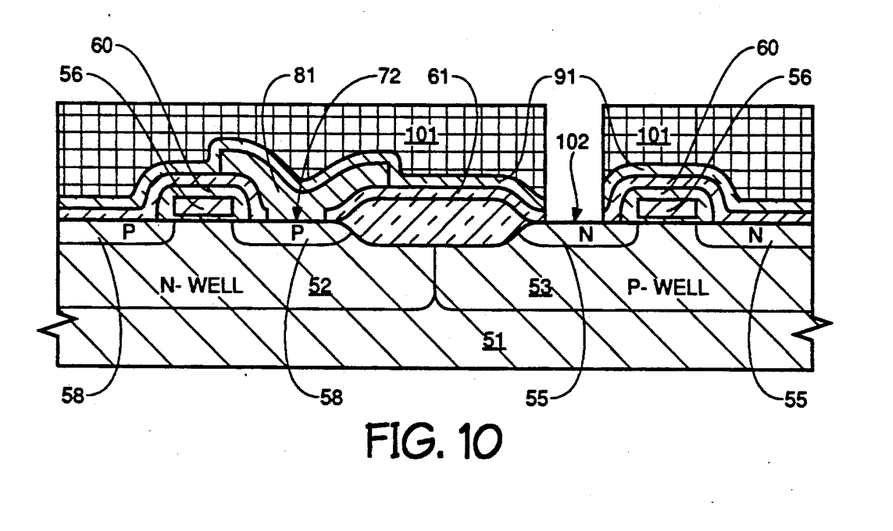

Referring now to FIG. 10, photoresist 101 is placed and appropriately masked to open buried contact location 102. Photoresist 101 is then stripped (not shown but apparent in FIG. 11).

Figure 11:
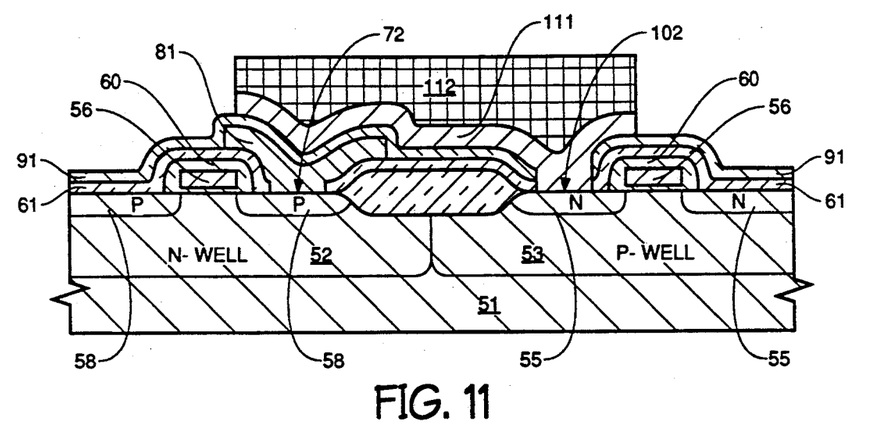

Referring now to FIG. 11, polysilicon 111 is deposited and then patterned by photoresist 112 to overlie a diffusion region 55 of NMOS transistor 54. Polysilicon 111 is then doped to an n-type conductivity thereby forming a buried contact at location 102. Photoresist 112 is then stripped (not shown but apparent in FIG. 12).

Figure 12:
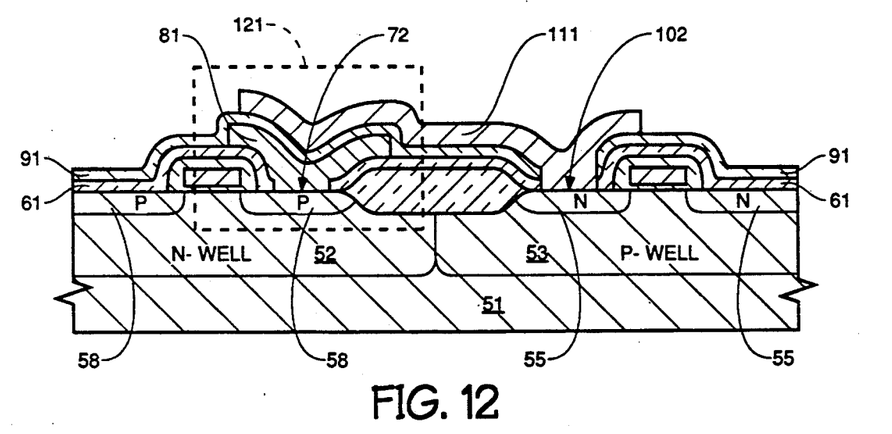

Referring now to FIG. 12, antifuse element 121 becomes apparent with the lower conductive plate being patterned polysilicon 81 and the upper conductive plate being the portion of polysilicon 111 directly overlying polysilicon 81 with thin dielectric 91 separating the two.

Figure 13:
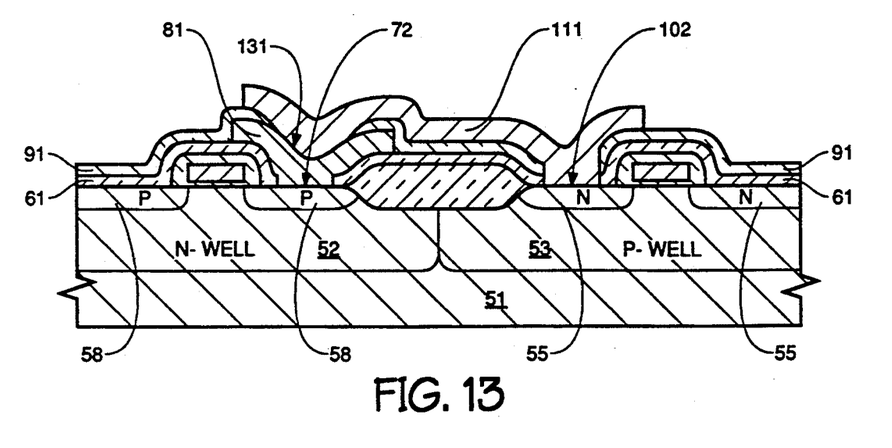
FIG. 13 is a cross-sectional view showing a programmed 3-dimensional antifuse structure.

FIG. 13 shows a programmed element where polysilicon plates 81 and 111 become shorted together to form a solid resistive contact 131, having a resistance of much less than 1 Meg ohm. Plates 81 and 111 could also be made from refractory metals, such as titanium or tantalum, or other conductive materials used by those skilled in the art.

It would be obvious to one skilled in the art that the order in which a given process develops PMOS transistors, NMOS transistors, buried contacts and the needed conductive and dielectric layers is not important and may be structured to the given process used. It is only important to develop the antifuse during normal DRAM capacitor construction in order to take advantage of the existing mask steps already required to develop a DRAM.

Therefore, it is to be understood that although the present invention has been described with reference to a stacked capacitor process, it could be implemented in a trench capacitor process as well. Various modifications known to those skilled in the art, may be made to the structure and process steps presented herein without departing from the invention as recited in the several claims appended hereto.

We claim:

1. A process to form a programmable 3-dimensional antifuse element in a dynamic random access memory fabricated on a starting substrate, said process comprising:

(a) forming a isolative dielectric layer over an existing surface of said starting substrate, said starting substrate surface having first and second conductors therein;

(b) masking and etching a first buried contact opening thereby exposing a portion of said first conductor;

(c) placing a first conductive material superjacent said isolative dielectric layer and said first conductor's xposed portion thereby forming a first buried contact between said first conductive material and said first conductor's exposed portion;

(d) patterning said first conductive material thereby leaving a patterened portion of said first conductive material aligned about said first buried contact;

(e) forming a dielectric layer superjacent said patterened first conductive material and said isolative dielectric layer;

(f) masking and etching a second buried contact opening thereby exposing a portion of said second conductor;

(g) placing a second conductive material superjacent said dielectric layer and said second conductor's exposed portion thereby forming a second buried contact between said second conductive material and said second conductor's exposed portion; and (h) patterning said second conductive material thereby leaving a patterned portion of said second conductive material aligned about said contact and extending to and overlying said first conductive material, said patterned first conductive material, the portion of said patterned second conductive material overlying said first patterned conductive material and the portion of said dielectric residing therebetween forming said programmable 3-dimensional antifuse structure.

2. The process as recited in claim 1, wherein said dynamic random access memory fabrication uses stacked capacitor technology.

3. The process as recited in claim 1, wherein said dynamic random access memory fabrication uses trench capacitor technology.

4. The process as recited in claim 1, wherein said first and second conductive plates comprise conductively doped polysilicon.

5. The process as recited in claim 1, wherein said first and second conductive plates comprise a refractory metal.

6. The process as recited in claim 5, wherein said refractory metal is tantalum.

7. The process as recited in claim 5, wherein said refractory metal is titanium.

8. The process as recited in claim 1, wherein said capacitor dielectric comprises oxide.

9. The process as recited in claim 1, wherein said said capacitor dielectric is 25 to 100 Å thick.

10. The process as recited in claim 1, wherein said capacitor dielectric comprises nitride.

11. The process as recited in claim 1, wherein said capacitor dielectric comprises a multiple layered dielectric.

12. The process as recited in claim 11, wherein said multiple layered dielectric comprises oxide/nitride/oxide layers.

* * * * *